United States Patent
Iovdalsky

(10) Patent No.: US 6,261,492 B1
(45) Date of Patent: Jul. 17, 2001

(54) METHOD FOR FITTING A SEMICONDUCTOR CHIP

(75) Inventor: Viktor Anatolievich Iovdalsky, Moskovskaya (RU)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/091,080

(22) PCT Filed: Oct. 10, 1996

(86) PCT No.: PCT/RU96/00292

§ 371 Date: Jul. 28, 1999

§ 102(e) Date: Jul. 28, 1999

(87) PCT Pub. No.: WO98/15974

PCT Pub. Date: Apr. 16, 1998

(51) Int. Cl.$^7$ ................................. B29C 35/00
(52) U.S. Cl. ............... 264/69; 264/261; 264/272.17; 156/293; 156/295
(58) Field of Search .................. 156/293, 295; 264/272.17, 272.15, 272.11, 261, 267, 69, 71; 29/840, 841

(56) References Cited

U.S. PATENT DOCUMENTS

| | | | |
|---|---|---|---|
| 2,264,632 | * 12/1941 | Gerlitzki | 156/295 |
| 3,963,551 | * 6/1976 | Marlinski | 156/295 |
| 4,239,576 | * 12/1980 | Taki et al. | 156/297 |
| 4,480,983 | * 11/1984 | Adams et al. | 425/467 |
| 4,749,120 | * 6/1988 | Hatada | 156/295 |
| 5,433,810 | * 7/1995 | Abrams | 156/295 |

FOREIGN PATENT DOCUMENTS

2138205 * 10/1984 (GB).

* cited by examiner

*Primary Examiner*—Angela Ortiz
(74) *Attorney, Agent, or Firm*—Piper Marbury Rudnick & Wolfe; Michael L. Kenaga

(57) ABSTRACT

The essence of the method resides in that a recess (2) is made in the mounting surface, having the dimensions exceeding those of a chip (3). The chip (3) is gripped with a gripping member appearing as a tool (4) having a flat end and a capillary hole (5) flaring up towards the tool end, and is oriented above the recess (2). Before pressing the chip (3) into the recess (2) a dosed amount of a binder (6) is placed therein. The chip (3) is pressed into the binder (6) until the part of the flat end of the tool (4) which extends beyond the outlines of the chip (3) thrusts against the mounting surface. The pressing-in procedure is stopped as soon as the face surface of the chip (3) is coincided with the surface on which the recess (2) is made, whereupon the gripping tool is disengaged.

11 Claims, 4 Drawing Sheets

METHOD FOR FITTING A SEMICONDUCTOR CHIP

FIELD OF THE INVENTION

This invention relates in general to electronic engineering and more specifically to a method for fitting the semiconductor chip.

BACKGROUND OF THE INVENTION

A method of fitting a semiconductor chip on the surface of an integrated circuit board or on the package bottom is known (cf "Assembly techniques of integrated circuits" by V. A. Dubolazov et al., "Vischa shkola" PH, Kiev, 1987, pp.60–62 (in Russian)), said method comprising a gripping of the chip with a tool which appears as a bar having a porthole for vacuum admission, and a recess in the end face, shaped as a frustum of pyramid, said recess being large enough for the chip to sink half its size into the recess. Then the board and the tool are heated, the chip is transferred to the bonding site and pressed against the mounting surface, whereupon vibration is applied thereto. Once the chip is attached with a binder (solder or adhesive) the source of vacuum is cut off and the tool is withdrawn.

However, the method discussed above fails to provide fitting of chips into the board volume (either into the recess in the board surface or in to the hole therein) so as the surface of the chip is coincided with that of the board. This results in a low reproducibility of the length of leads and reduces the chip bonding accuracy.

One more prior-art fitting method is known (GB, B, 2,138,205), wherein the manufacturing process of a microwave circuit consists in that the semiconductor chip is pressed into the tool which is in fact a bar having a flat end and a capillary in the central portion, said capillary so flaring out towards the end tool portion that the edges of the tool end portion overlap the peripheral chip portion and extend beyond the limits thereof, thus locally deforming the substrate. As a result, a hollow is formed having the shape and depth corresponding to those of the chip which is held in the substrate by virtue of its thrusting against the faces of the hollow. Reduced deformation of the lower substrate surface is attained due to use of the initial recess.

However, with the aforesaid method for chip fitting the substrate is deformed and its flatness is upset. Moreover, the method suffers from low manufacturability.

When pressing the chip into such a substrate it is hard to determine the instant when the pressing is terminated, which might inflict a distortion upon the substrate when the surface of the chip is coinceded with that of the circuit board. The distortion of the substrate reverse side disturbs its flatness, which hampers substrate mounting on a heat sink base.

SUMMARY OF THE INVENTION

The present invention has for its principal object to provide a method for fitting the semiconductor chip, wherein the chip is so pressed into the recess in the mounting surface as to attain higher manufacturability of the process and accuracy of the chip fitting due to a prevention of a substrate distortion.

The foregoing object is accomplished due to the fact in a method for fitting the semiconductor chip, wherein a recess is made in the mounting surface, the chip is gripped from its face side with a gripping tool having a flat end and a capillary hole in its central portion, said hole flaring up towards the tool end, the chip is oriented above said recess and pressed thereinto until the chip face surface is coincided with the mounting surface, whereupon the gripping tool is released, according to the invention, the recess has the dimensions exceeding those of the chip, the pressing of the latter into the recess is preceded by placing a specified amount of a binder in said recess, the chip is pressed into said binder until that portion of the tool flat end which extends beyond the chip outlines thrusts against the mounting surface so that the space confined between the chip and the surface of the recess gets partially or completely filled with the binder.

Used as the mounting surface may be the surface of the integrated circuit board substrate, or the surface of the package, or that of the base of the hybrid integrated circuit.

The gripping tool is not released until the binder solidifies.

The recess may be at least partially metal-coated, and an electrically conducting material may be used as the binder.

Vibrations may be applied to the gripping tool and/or to the surface wherein the recess is made, at the instant of chip pressing-in.

The chip may be gripped by a vacuum suction cup, and an excess pressure of 0.1 to 300 mm Hg is applied to the capillary hole in the tool in the lapse of time between releasing the chip from the tool and disconnection of the source of vacuum.

The chip pressing-in procedure may be ceased by causing part of the tool to thrust against the surface in which the recess is made. The tool extends beyond the limits of the recess by 1 to 500 $\mu$m, and the length and width of the recess exceed the chip dimensions by 0.01 to 1.0 mm, and the depth thereof exceeds the chip thickness by 0.001 to 0.5 mm.

The chip pressing-in procedure may be ceased by causing a part of the tool to thrust against the surface in which the recess is made and which is free from the topological metallization pattern, or by causing a part of the tool gripping member rigidly coupled to the tool to do so.

Placing a specified amount of the binder in the recess prior to chip pressing-in provides for catching the chip by the binder without distorting the substrate, and ceasing the chip pressing-in procedure at the instant when the chip face surface is coincided with the surface in which the recess is made, ensures that the leads for welding can be as short as possible.

The minimum amount of the binder is selected so as to provide strong holding of the chip in place, while the maximum amount thereof is selected so as to prevent the chip against getting out of the recess, which might result in shorting the leads when the binder is electrically conducting, or in soiling the chip surface when the binder is nonconducting, which might impede welding the leads to the contact pads.

Providing the metallization in the recess and making use of an electrically conducting binder enables one to hold the chip reliably using a solder and also facilitates grounding of the chip.

Applying vibration to the chip and/or to a component, wherein the recess is made, at the instant of the chip pressing-in makes it possible to improve the quality of the soldered joint.

Gripping the chip with the vacuum suction cup makes it possible to prevent the chip from displacement during tool disconnection by applying an excess pressure into the tool channel, the lower limit value of the pressure applied into the tool being determined by the minimum pressure applied thereto in order to balance the force by which the chip is attracted to the tool, while the upper limit value of pressure is selected such that an air or gas stream would not displace the chip pressed into the recess.

Solidificating the binder before disconnecting the tool from the chip promotes to hold the latter and reduces the probability of its displacement during tool disengagement.

Ceasing the chip pressing-in procedure by making the tool to thrust against the board surface at the edges of the recess enables one to attain the desired effect by virtue of a predetermined ratio between the dimensions of the recess, the chip, and the tool, without any additional forces, and to automate the technological process.

The necessary conditions for cessating the pressing-in procedure are provided, on the one hand, by a minimum amount of tool engagement with the chip and, on the other hand, by the necessity to save the material the tool is made from. An excess of the recess dimensions over those of the chip makes possible such an arrangement of the chip in the recess that the plane of the chip face surface is coincide with that of the board surface.

The dimensions of the recess for the chip are limited from below by a possibility to fit the chip, and from above they are limited by deteriorating the dimensional characteristics.

Ceasing the pressing-in procedure at the instant when the tool thrusts against the surface free from the topological metallization pattern protects the rust preventive metallization coating from damage.

BRIEF DESCRIPTION OF THE DRAWINGS

The present invention is illustrated by some specific exemplary embodiments thereof to be taken with reference to the accompanying drawings, wherein.

BEST METHOD OF CARRYING OUT THE INVENTION

Figure 1:
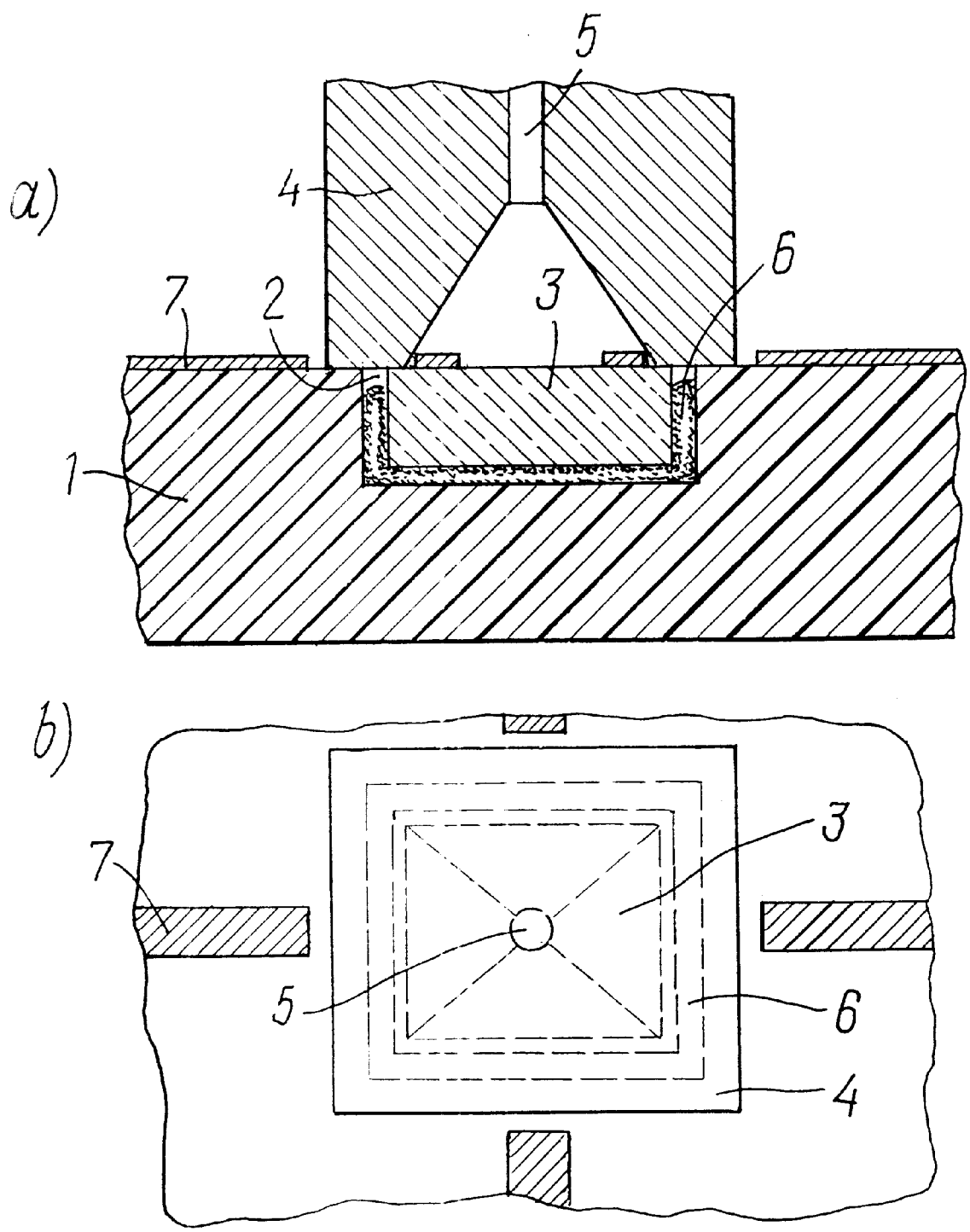
FIG. 1 shows schematically the procedure of fitting the chip in the recess made on the substrate surface.
Figure 2:
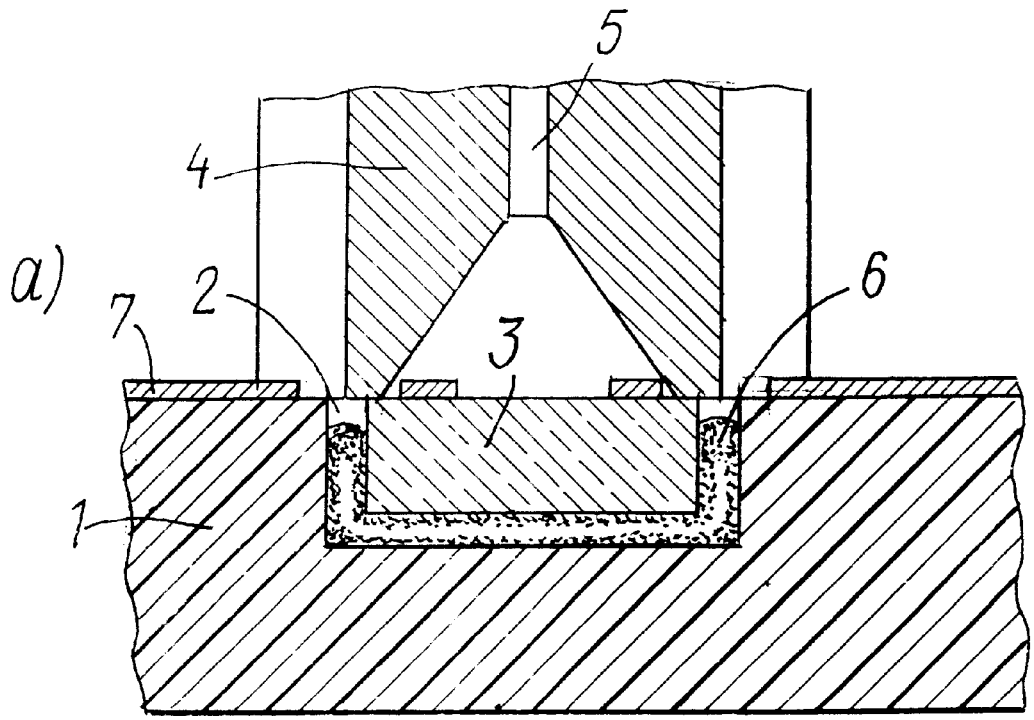
FIGS. 2 through 4 illustrate the fitting of the chip in the recess, using a tool having configuration that prevents the topological metallization pattern against damage.
Figure 2:
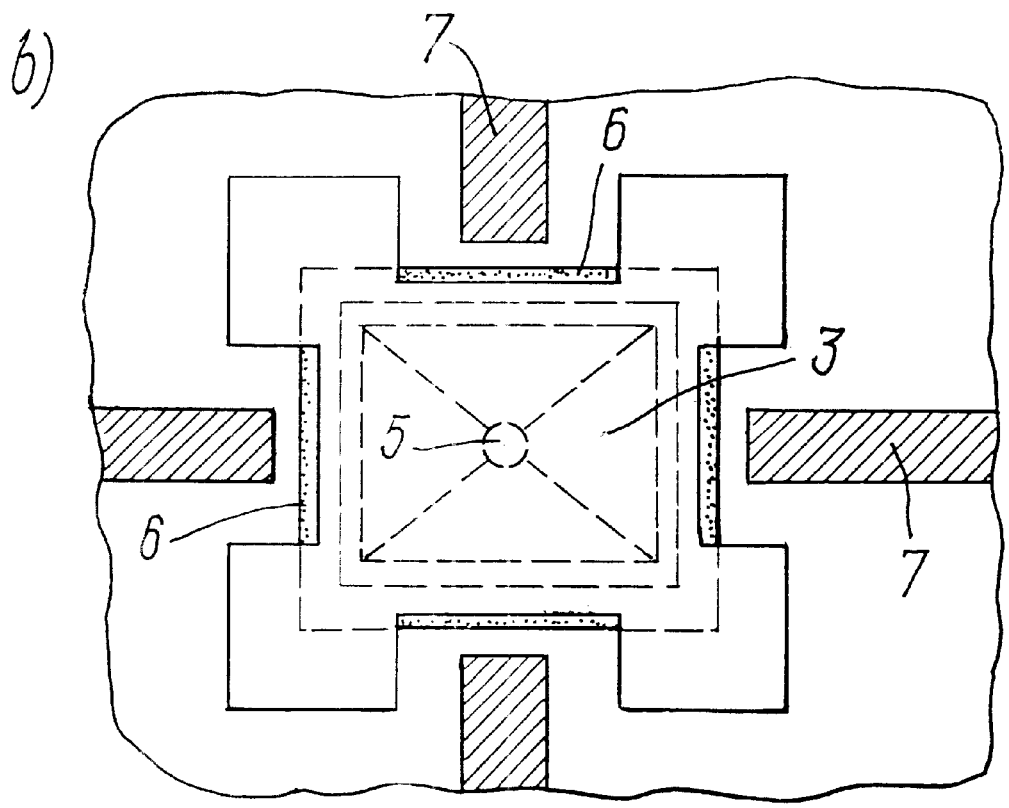
Figure 3:
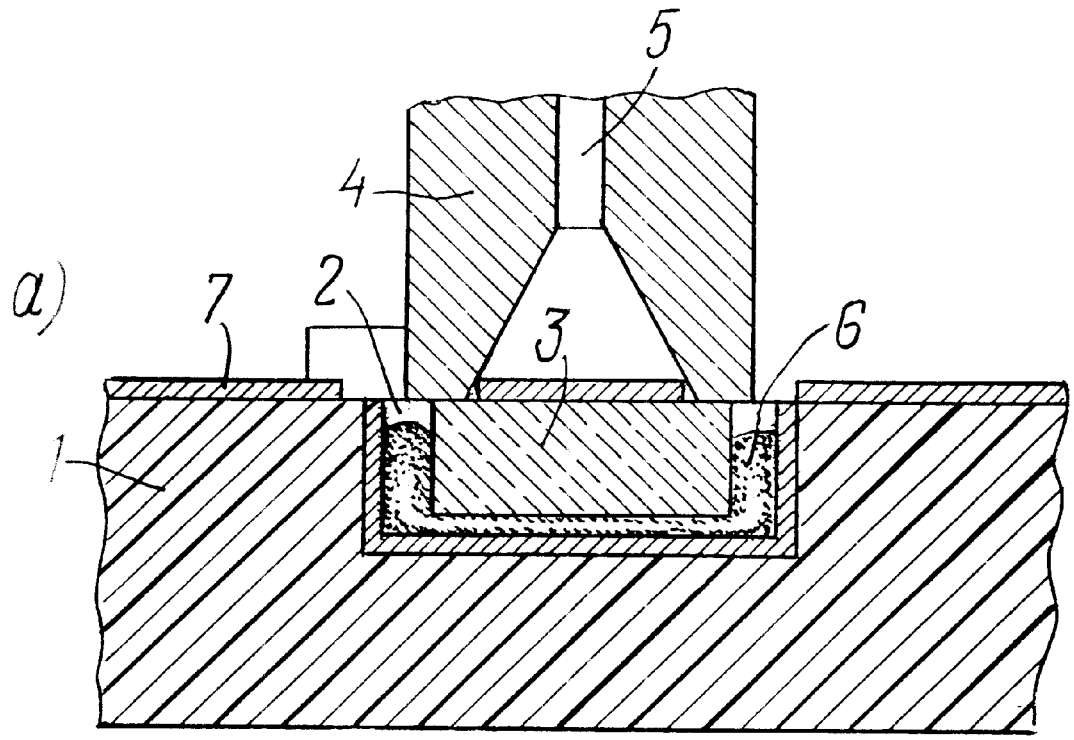
Figure 3:
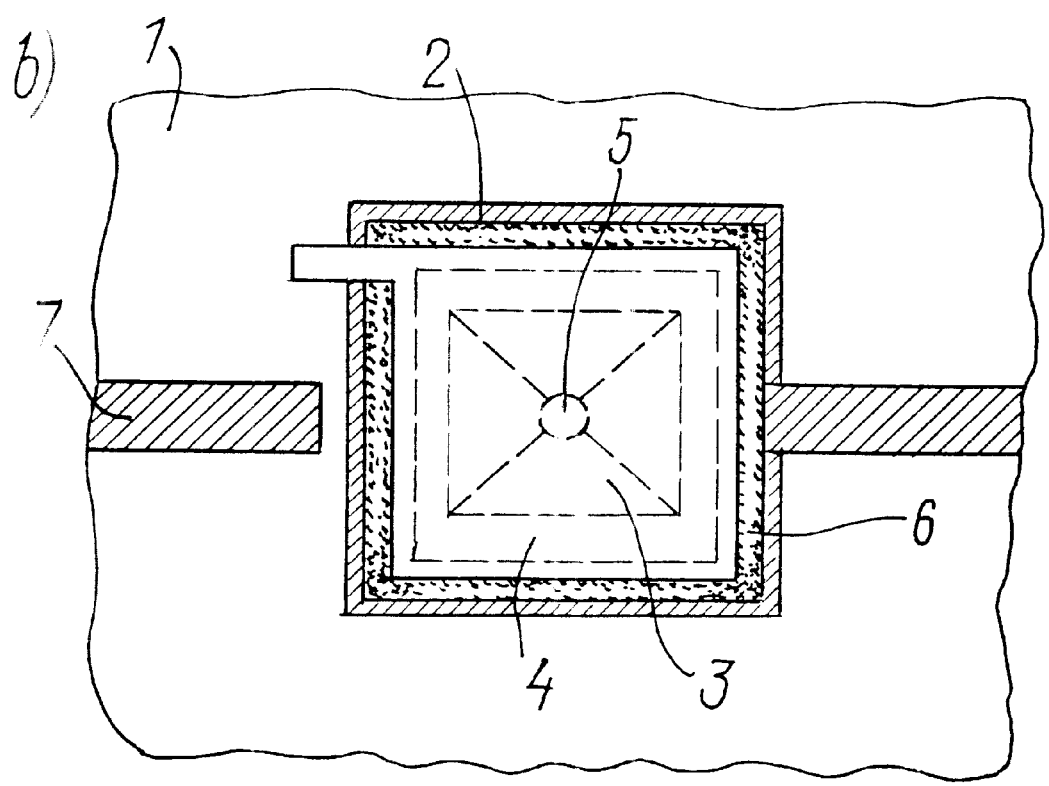
Figure 4:
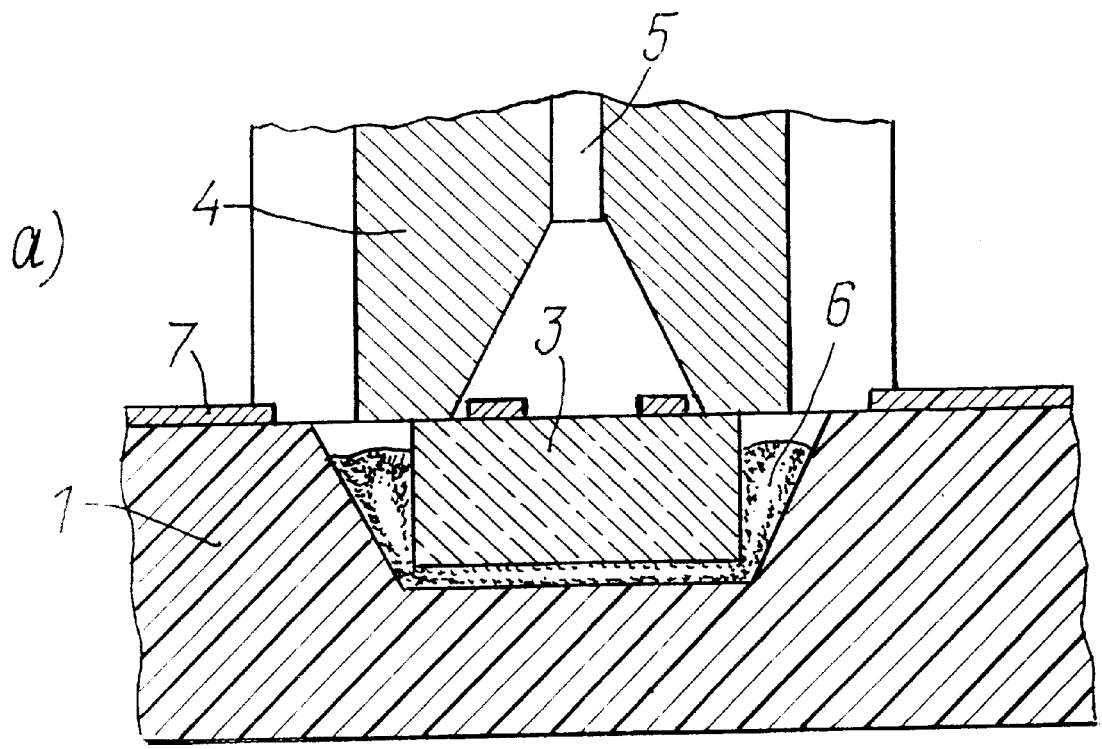
Figure 4:
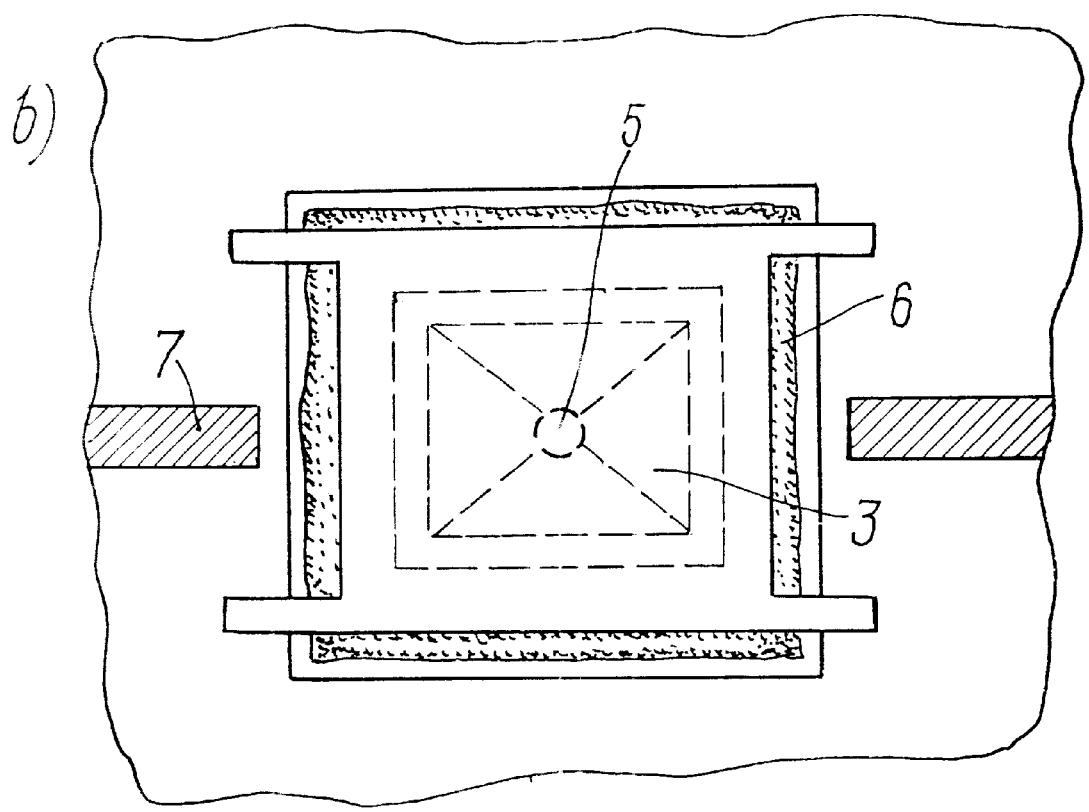

The filed method for fitting the semiconductor chip,. e.g., the П325A-5 transistor of 0.5×0.5×0.15 mm, is carried out as follows.

A recess 2 is made in a circuit board substrate 1 of, e.g., Polycor, using, for instance, a known precision laser milling technique, the dimensions of the recess 2 exceeding those of a chip 3 by 0.1 mm. Then the chip 3 is gripped from the side of its face surface with the use of a gripping tool 4 having a flat end extending by 1 to 1500 $\mu$m beyond the recess, and a capillary hole 5 made in the tool central portion and flaring up towards the tool end. A vacuum suction cup is used as the tool 4. Next the chip 3 is oriented over the recess 2 into which a dosed amount, e.g., 0.0005 g, of a binder 6 is placed, the surface of the recess 2 is previously partially metallized. An eutectic Au—Ge solder may be used as the binder 6. Once the solder has been heated, the chip 3 is pressed thereinto until its face surface is coincided with the circuit board surface, which is due to the fact that part of the flat end of the tool 4 thrusts against the surface in which the recess 2 is made. The dimensions of said part of the tool 4 exceed those of the recess 2 by 0.2 mm. While pressing the chip 3 into the recess vibrations are applied either to the tool 4 or to the board substrate 1. Thereupon the solder is cooled down to a temperature below the melting point with, e.g. a stream of cold air, whereby the solder solidifies, thus securing the chip 3 in the recess. The chip is released by disconnecting the source of vacuum from the vacuum suction cup which is preceded by applying an excess pressure of 0.1 to 300 mm Hg to the suction cup.

The recess into which the chip 3 is pressed may be made not only on the surface of the circuit board substrate 1 but also on the surface of the package or on the base of a hybrid integrated circuit.

Practical application of the proposed method allows to eliminate the possibility of distorting the substrate and to attain higher manufacturability and accuracy of the chip fitting process. In addition, when used in serial production the proposed method allows of execute the automated fitting of the chip into the recess in such a manner that the chip plane is coplanar with the circuit board plane, whereby the connection leads are as short as possible and hence the spurious inductance of the leads is minimized. And since a golden wire is commonly used for connection leads, the method enables to save precious metals.

Though some specific preferred embodiments of the present invention have been disclosed in the foregoing description, it will be understood that various modifications and improvements may occur which do not however depart from the spirit and scope of the invention.

INDUSTRIAL APPLICABILITY

The present invention can be used for fitting the semiconductor chips into the substrate of a hybrid integral circuit or into the bases of semiconductor devices packages.

What is claimed is:

1. A method for fitting a semiconductor chip, wherein a recess (2) is made in a mounting surface, the chip (3) is gripped from its face side with a gripping tool (4) having a flat end and a capillary hole (5) in its central portion, said hole flaring up towards an end of the tool, said chip (3) is oriented above the recess (2) and pressed into said recess until the face surface of the chip (3) is coincided with the mounting surface, whereupon the gripping tool is released, CHARACTERIZED in that the recess (2) has the dimensions exceeding those of the chip (3), pressing the chip (3) into the recess (2) is preceded by placing a dosed amount of a binder (6) in said recess, the chip (3) is pressed into said binder (6) until that portion of the tool flat end which extends beyond the outlines of the chip (3) thrusts against the mounting surface so that the space confined between the chip (3) and the surface of the recess (2) gets filled partially or completely with the binder (6).

2. The method for fitting the semiconductor chip as set forth in claim 1, wherein the mounting surface is an integrated circuit board.

3. The method for fitting the semiconductor chip as set forth in claim 1, wherein the gripping tool is not released until the binder (6) solidifies.

4. The method for fitting the semiconductor chip as set forth in claim 1, wherein prior to placing the dosed amount of the binder (6), the surface of the recess (2) is at least partially metal coated, and the binder (6) is an electrically conducting material.

5. The method for fitting the semiconductor chip as set forth in claim 2, wherein while pressing the chip (3) into the recess (2) vibrations are applied to the gripping tool (4).

6. The method for fitting the semiconductor chip as set forth in claim 1 wherein a vacuum suction cup is used as the gripping tool (4) and said gripping tool being disengaged by disconnecting the source of vacuum from the vacuum suction cup which is preceded by applying an excess pressure of 0.1 to 300 mm Hg to the vacuum suction cup.

7. The method for fitting the semiconductor chip as set forth in claim 1, wherein the length and width of the recess (2) exceed the respective chip dimensions by 0.01 to 1.0 mm, and the depth of said recess (2) exceeds the thickness of the chip by 0.001 to 0.5 mm, and the gripping tool (4) extends with its flat end beyond the limits of the recess (2) by 1 to 500 μm.

8. The method for fitting the semiconductor chip as set forth in claim 2 wherein while pressing in the chip (3), the part of the flat end of the tool (4) thrusts against the surface, whereon the recess (2) is made, on its areas free from a topological metallization pattern (7).

9. The method for fitting the semiconductor chip as set forth in claim 1, wherein the mounting surface is a surface of a package.

10. The method for fitting the semiconductor chip as set forth in claim 1, wherein the mounting surface is a base of a hybrid integrated circuit.

11. The method for fitting the semiconductor chip as set forth in claim 1, wherein while pressing the chip (3) into the recess (2) vibrations are applied to the mounting surface.

* * * * *